(12) United States Patent
Tanaka (10) Patent No.: US 11,139,793 B2
(45) Date of Patent: Oct. 5, 2021

(54) DIPLEXER

(71) Applicant: Murata Manufacturing Co., Ltd., Nagaokakyo (JP)

(72) Inventor: Akira Tanaka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/926,931

(22) Filed: Jul. 13, 2020

(65) Prior Publication Data

US 2021/0028753 A1    Jan. 28, 2021

(30) Foreign Application Priority Data

Jul. 22, 2019   (JP) .............................. JP2019-134496

(51) Int. Cl.
| | | |
|---|---|---|
| *H03H 7/46* | (2006.01) | |
| *H03H 7/01* | (2006.01) | |
| *H03H 7/09* | (2006.01) | |
| *H03H 7/03* | (2006.01) | |

(52) U.S. Cl.
CPC .......... *H03H 7/463* (2013.01); *H03H 7/0115* (2013.01); *H03H 7/03* (2013.01); *H03H 7/09* (2013.01); *H03H 7/1758* (2013.01); *H03H 7/1775* (2013.01)

(58) Field of Classification Search
CPC .......... H03H 7/46; H03H 7/461; H03H 7/463; H03H 7/0115
USPC .......................... 333/110, 126, 129, 132, 134
See application file for complete search history.

(56) References Cited

U.S. PATENT DOCUMENTS

2017/0126198 A1* 5/2017 Mukai ................. H03H 7/0115

FOREIGN PATENT DOCUMENTS

| JP | 2004-281847 A | 10/2004 |
| JP | 2016-039334 A | 3/2016 |
| JP | 2019-091995 A | 6/2019 |

* cited by examiner

*Primary Examiner* — Rakesh B Patel
(74) *Attorney, Agent, or Firm* — Keating & Bennett, LLP (57) ABSTRACT

A diplexer includes dielectric layers stacked in a lamination direction. The diplexer includes a reference surface extending in a direction orthogonal or substantially orthogonal to the lamination direction, a common terminal on the reference surface, a high-pass circuit including a capacitor, a low-pass circuit including an inductor, a common line connecting the common terminal and a branch portion, a first via connecting the branch portion and the capacitor in the high-pass circuit, and a second via connecting the branch portion and the inductor in the low-pass circuit. The first via extends along the lamination direction from a first layer where the branch portion is located to a second layer where the capacitor in the high-pass circuit is located.

16 Claims, 10 Drawing Sheets

COMPARATIVE EXAMPLE

FIG. 8

PRESENT DISCLOSURE

DIPLEXER

CROSS REFERENCE TO RELATED APPLICATIONS

This application claims the benefit of priority to Japanese Patent Application No. 2019-134496 filed on Jul. 22, 2019. The entire contents of this application are hereby incorporated herein by reference.

BACKGROUND OF THE INVENTION

1. Field of the Invention

The present disclosure relates to diplexers.

2. Description of the Related Art

An example of a diplexer including a high-pass circuit configured to allow high-frequency signals in a higher frequency band than a characteristic frequency (hereinafter also referred to as "high band HB") to pass therethrough and a low-pass circuit configured to allow high-frequency signals in a lower frequency band than the characteristic frequency (hereinafter also referred to as "low band LB") to pass therethrough is disclosed in Japanese Unexamined Patent Application Publication No. 2016-39334.

The diplexer disclosed in Japanese Unexamined Patent Application Publication No. 2016-39334 includes a multilayer body in which a plurality of dielectric layers are laminated in a lamination direction. In that diplexer, a common terminal shared by the high-pass circuit and the low-pass circuit is arranged on a lower surface of the multilayer body. A single via extending from the common terminal toward an upper surface of the multilayer body is disposed inside the multilayer body. That via is directly connected to a capacitor in the high-pass circuit and an inductor in the low-pass circuit.

In the diplexer disclosed in Japanese Unexamined Patent Application Publication No. 2016-39334, the capacitor in the high-pass circuit is directly connected to the via extending from the common terminal toward the upper surface of the multilayer body at the same layer as the layer where that capacitor is disposed. In such a configuration, in particular, when the band width between the low band LB and the high band HB is narrow (the difference between an upper-limit frequency of the low band LB and a lower-limit frequency of the high band HB is small), a return loss in the high-pass circuit may not be appropriately suppressed, and the configuration is susceptible to improvement.

SUMMARY OF THE INVENTION

Preferred embodiments of the present invention provide diplexers each including a high-pass circuit and a low-pass circuit, and in each of which return loss in the high-pass circuit is able to be reduced or prevented.

According to a preferred embodiment of the present invention, a diplexer includes a plurality of dielectric layers laminated in a lamination direction, a reference surface extending in a direction orthogonal or substantially orthogonal to the lamination direction, a common terminal disposed on the reference surface, a high-pass circuit configured to allow a signal with a frequency higher than a characteristic frequency to pass therethrough, a low-pass circuit configured to allow a signal with a frequency lower than the characteristic frequency to pass therethrough, a common line including a first end portion connected to the common terminal, a first line connecting a second end portion of the common line and the high-pass circuit, and a second line connecting the second end portion of the common line and the low-pass circuit. The high-pass circuit includes a capacitor directly connected to the first line. The first line includes a first via extending along the lamination direction from a first layer at which the second end portion of the common line is disposed to a second layer at which the capacitor in the high-pass circuit is disposed.

According to a preferred embodiment of the present invention, a diplexer includes a plurality of dielectric layers laminated in a lamination direction, a reference surface extending in a direction orthogonal or substantially orthogonal to the lamination direction, a common terminal disposed on the reference surface, a high-pass circuit configured to allow a signal with a frequency higher than a characteristic frequency to pass therethrough, a low-pass circuit configured to allow a signal with a frequency lower than the characteristic frequency to pass therethrough, a first line connecting the common terminal and the high-pass circuit, and a second line connecting the common terminal and the low-pass circuit and different from the first line. The high-pass circuit includes a capacitor directly connected to the first line. The first line includes a first via extending along the lamination direction from the common terminal to a layer where the capacitor in the high-pass circuit is disposed.

With diplexers according to preferred embodiments of the present invention, the upper-side end portion of the common line and the capacitor in the high-pass circuit are connected by the first via. By that first via, an inductance component is added between the upper-side end portion of the common line and the capacitor in the high-pass circuit. Thus, the matching of the high-pass circuit is improved. Consequently, the return loss in the high-pass circuit is able to be appropriately reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments are described in detail below with reference to the drawings. The same or corresponding portions in the drawings have the same reference numerals, and description thereof is not repeated.

Configuration of Diplexer

Figure 1:
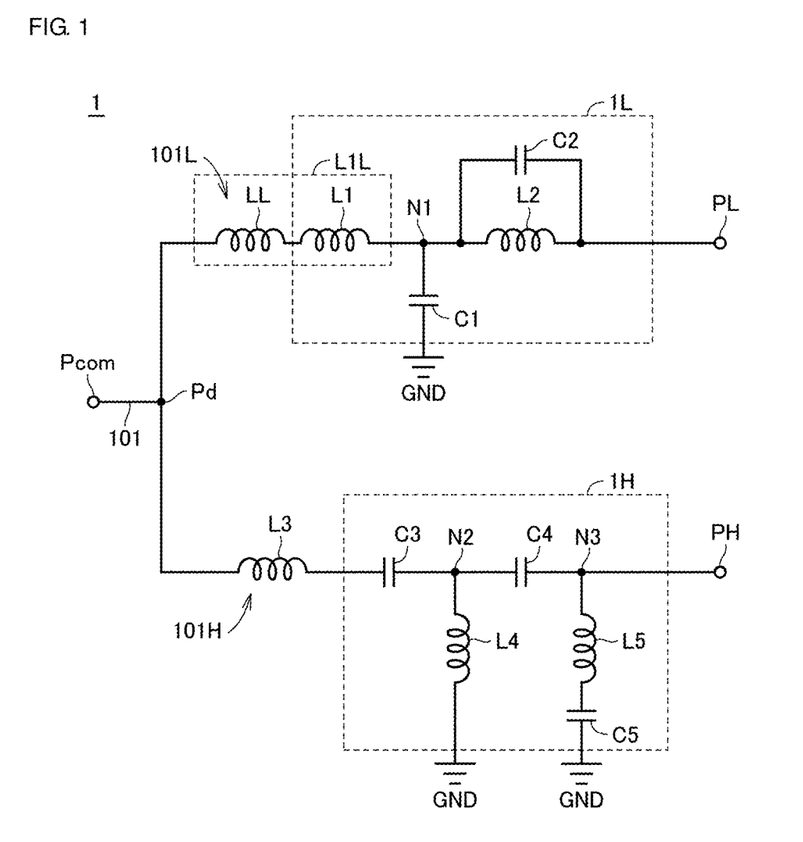
FIG. 1 is an equivalent circuit diagram of a diplexer according to a preferred embodiment of the present invention.

FIG. 1 is an equivalent circuit diagram of a diplexer 1 according to a preferred embodiment of the present invention. The diplexer 1 includes a high-pass circuit 1H and a low-pass circuit 1L. The high-pass circuit 1H is configured to allow high-frequency signals in a high band HB higher than a characteristic frequency to pass therethrough. The low-pass circuit 1L is configured to allow high-frequency signals in a low band LB lower than the characteristic frequency to pass therethrough. The diplexer 1 may be used in, for example, a dual-band communication device, which can perform communications in two frequency bands of the high band HB and low band LB.

In the following description, the case where the characteristic frequency is on the order of about 2.25 GHz, a lower-limit frequency f11 and an upper-limit frequency f12 of the low band LB are about 0.96 GHz and about 2.20 GHz, respectively, and a lower-limit frequency f21 and an upper-limit frequency f22 of the high band HB are about 2.30 GHz and about 2.69 GHz, respectively, is described as an example.

The diplexer 1 further includes, in addition to the high-pass circuit 1H and low-pass circuit 1L, a common terminal Pcom, a common line 101, a first line 101H, a second line 101L, a first terminal PH, a second terminal PL, and a ground terminal GND.

The common terminal Pcom is connected to a first end portion of the common line 101. A second end portion of the common line 101 is connected to a branch portion Pd. The first line 101H connects the branch portion Pd and the high-pass circuit 1H. The second line 101L connects the branch portion Pd and the low-pass circuit 1L.

The low-pass circuit 1L is connected between the second line 101L and the second terminal PL. The low-pass circuit 1L is a filter disposed between the second line 101L and the second terminal PL and configured to allow high-frequency signals lying within the low band LB to pass therethrough. Specifically, the low-pass circuit 1L includes an inductor L1, a capacitor C1, an inductor L2, and a capacitor C2. The inductor L1 includes a first end portion directly connected to the second line 101L and a second end portion connected to the inductor L2. The capacitor C1 is connected between a node N1 and the ground terminal GND, and the node N1 is positioned between the inductors L1 and L2. The capacitor C2 and the inductor L2 are connected in parallel with each other between the node N1 and the second terminal PL. The inductor L1 in the low-pass circuit 1L can correspond to "inductor" in the present disclosure.

As described below, the second line 101L, which connects the common line 101 and the inductor L1 in the low-pass circuit 1L, includes a second via B2 and includes an inductance component provided the second via B2. Therefore, the second line 101L can be indicated as an inductor LL in the equivalent circuit. The second line 101L and the inductor L1 are connected in series with each other. Thus, the low-pass circuit 1L can be regarded as including one inductor L1L in which the inductor LL in the second line 101L and the inductor L1 in the low-pass circuit 1L are combined, as illustrated in FIG. 1.

The high-pass circuit 1H is connected between the first line 101H and the first terminal PH. The high-pass circuit 1H is a filter disposed between the first line 101H and the first terminal PH and configured to allow high-frequency signals lying within the high band HB to pass therethrough. Specifically, the high-pass circuit 1H includes a capacitor C3, an inductor L4, a capacitor C4, an inductor L5, and a capacitor C5. The capacitor C3 includes a first end portion directly connected to the first line 101H and a second end portion connected to the capacitor C4. The inductor L4 is connected between a node N2 and the ground terminal GND, and the node N2 is positioned between the capacitors C3 and C4. The capacitor C4 is connected between the capacitor C3 and the first terminal PH. The inductor L5 and the capacitor C5 are connected in series with each other between a node N3 and the ground terminal GND, and the node N3 is positioned between the capacitor C4 and the first terminal PH. The capacitor C3 in the high-pass circuit 1H can correspond to "capacitor" in the present disclosure.

As described below, the first line 101H, which connects the common line 101 and the capacitor C3 in the high-pass circuit 1H, includes a first via B1 and includes an inductance component provided by the first via B1. Therefore, the first line 101H can be indicated as an inductor L3 in the equivalent circuit.

Figure 2:
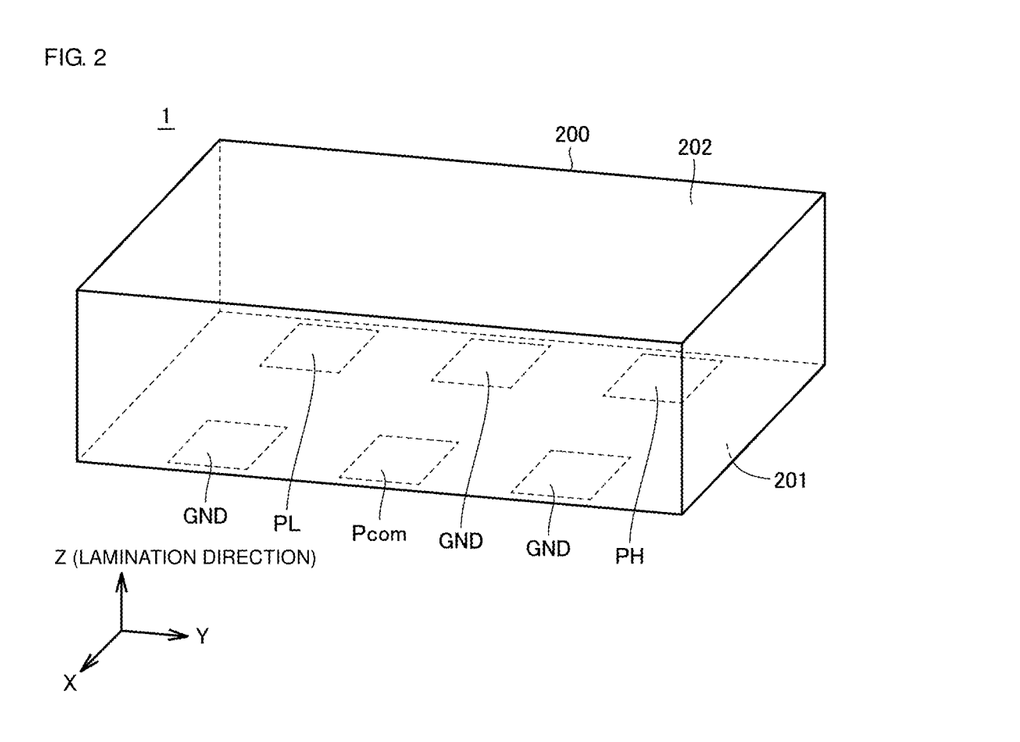
FIG. 2 is an external perspective view of the diplexer.

FIG. 2 is an external perspective view of the diplexer 1. The diplexer 1 includes a multilayer body (dielectric body) 200 in which a plurality of dielectric layers are laminated in a lamination direction. In the following description, the lamination direction of the plurality of dielectric layers may be referred to as "Z-axis direction," and directions perpendicular or substantially perpendicular to the Z-axis direction and perpendicular or substantially perpendicular to each other may be referred to as "X-axis direction" and "Y-axis direction," respectively. In the following description, the positive direction in the Z axis is described as the upper side, and the negative direction is described as the lower side.

The multilayer body 200 in the diplexer 1 includes a bottom surface 201 and a top surface 202. The above-described common terminal Pcom, first terminal PH, second terminal PL, and ground terminal GND are planar and land grid array (LGA) terminals regularly arranged on the bottom surface 201. FIG. 2 illustrates an example in which the ground terminal GND is provided in a plurality of (three, in the example illustrated in FIG. 2) locations. The bottom surface 201 of the diplexer 1 is connected to a circuit board (not illustrated). The bottom surface 201 of the diplexer 1 can correspond to "reference surface".

Figure 3:
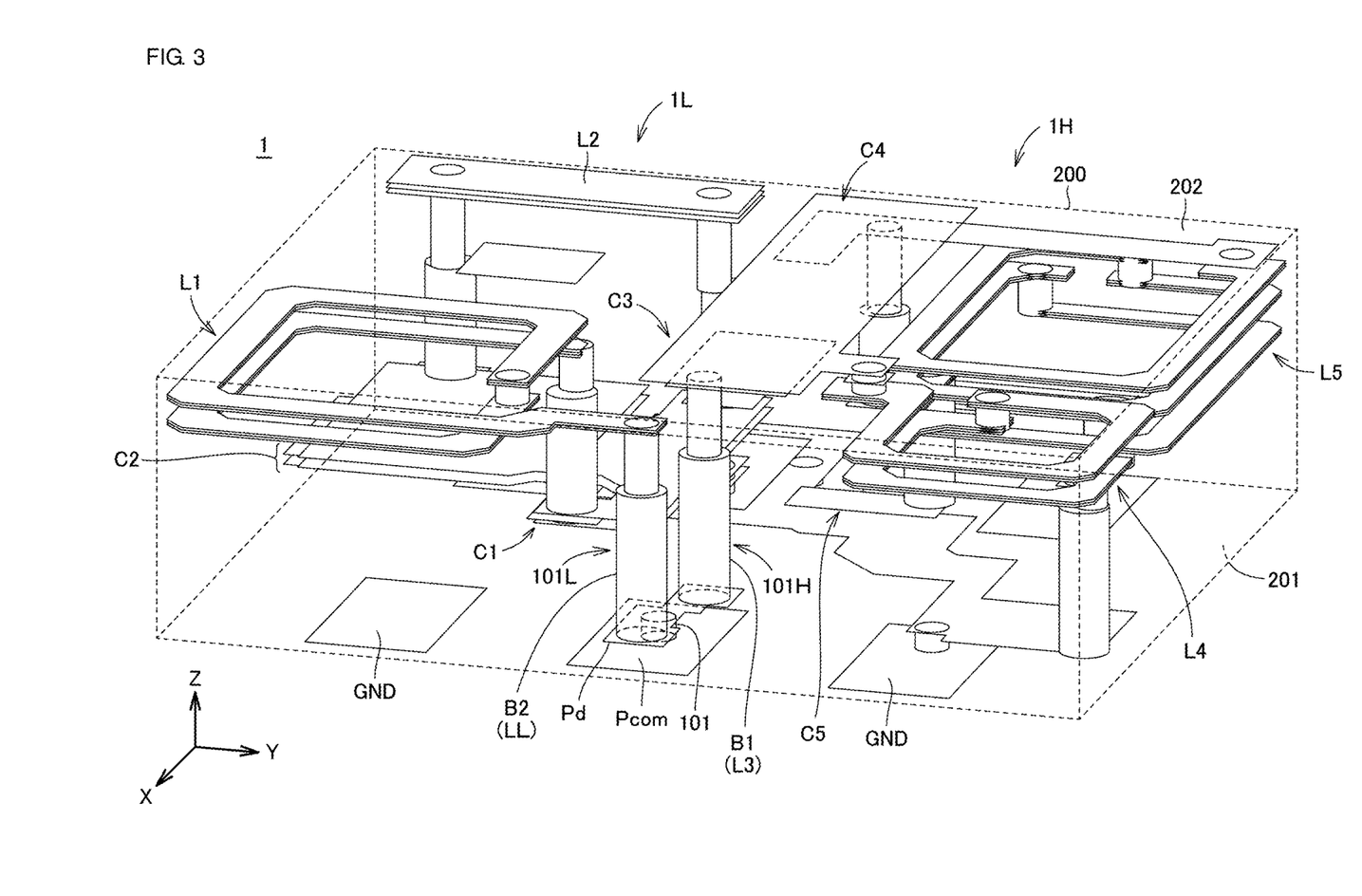
FIG. 3 is a perspective view of an internal portion of a multilayer body in the diplexer.

FIG. 3 is a perspective view of an internal portion of the multilayer body 200 in the diplexer 1. In the diplexer 1, a plurality of electrodes and other elements defining the equivalent circuit illustrated in FIG. 1 are disposed inside the multilayer body 200.

The common line 101 includes a single via extending in the Z-axis direction. A lower-side end portion of the common line 101 is connected to the common terminal Pcom. An upper-side end portion of the common line 101 is connected to a substantially central portion of the planar branch portion Pd extending along the XY plane orthogonal or substantially orthogonal to the Z-axis direction.

The branch portion Pd is connected to the capacitor C3 in the high-pass circuit 1H with the first line 101H interposed therebetween. As described above, the high-pass circuit 1H includes the inductor L4, capacitor C4, inductor L5, and capacitor C5, in addition to the capacitor C3.

The branch portion Pd is also connected to the inductor L1 in the low-pass circuit 1L with the second line 101L interposed therebetween. As described above, the low-pass circuit 1L includes the capacitor C1, inductor L2, and capacitor C2, in addition to the inductor L1.

The first line 101H includes the first via B1, which connects the branch portion Pd and the capacitor C3 in the high-pass circuit 1H. The second line 101L includes the second via B2, which connects the branch portion Pd and the inductor L1 in the low-pass circuit 1L. The first via B1 and second via B2 both extend in the Z-axis direction (lamination direction) and are adjacent to each other. The first via B1 and second via B2 can correspond to "first via" and "second via," respectively, in the present disclosure.

Figure 4:
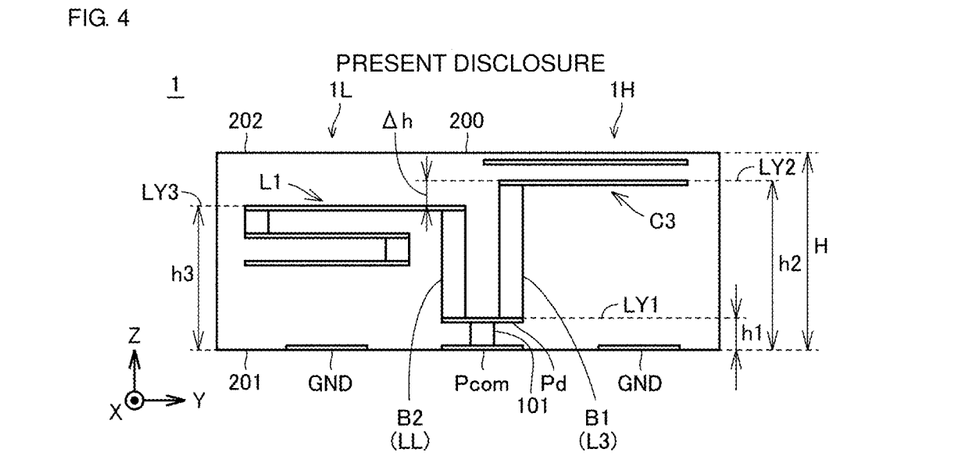
FIG. 4 schematically illustrates an internal configuration of the diplexer.

FIG. 4 schematically illustrates an internal configuration of the diplexer 1. In FIG. 4, a circuit from the common terminal Pcom to the capacitor C3 in the high-pass circuit 1H and a circuit from the common terminal Pcom to the inductor L1 in the low-pass circuit 1L are illustrated, and other circuits are omitted.

In the following description, the dielectric layer where the branch portion Pd is disposed may be referred to as "first layer LY1," the dielectric layer where the capacitor C3 in the high-pass circuit 1H is disposed may be referred to as "second layer LY2," and the dielectric layer where the inductor L1 in the low-pass circuit 1L may be referred to as "third layer LY3." The first layer LY1, second layer LY2, and third layer LY3 can correspond to "first layer," "second layer," and "third layer," respectively, in the present disclosure.

In the diplexer 1, a height h2 of the second layer LY2 (distance from the bottom surface 201 to the second layer LY2 in the Z-axis direction) and a height h3 of the third layer LY3 (distance from the bottom surface 201 to the third layer LY3 in the Z-axis direction) are both larger than a height h1 of the first layer LY1 (distance from the bottom surface 201 to the first layer LY1 in the Z-axis direction). In particular, in the present preferred embodiment, the height h1 of the first layer LY1 is preferably, for example, smaller than about one-half of a dimension H of the diplexer 1 in the lamination direction, and the height h2 of the second layer LY2 and the height h3 of the third layer LY3 are preferably, for example, not smaller than about one-half of the dimension H of the diplexer 1 in the lamination direction.

In the diplexer 1, the height h2 of the second layer LY2 is larger than the height h3 of the third layer LY3 by a difference Δh. The first via B1 extends along the Z-axis direction from the first layer LY1 to the second layer LY2. The second via B2 extends along the Z-axis direction from the first layer LY1 to the third layer LY3. Accordingly, the first via B1 is longer than the second via B2 by the difference Δh.

Characteristics of Diplexer

The characteristics of the diplexer 1 having the above-described configuration are described below.

Matching of High-Pass Circuit

As illustrated in FIGS. 3 and 4 described above, in the diplexer 1 according to the present preferred embodiment, the branch portion Pd, which is connected to the upper-side end portion of the common line 101, and the capacitor C3 in the high-pass circuit 1H are connected by the first via B1. The inductance component (inductor L3) provided by the first via B1 is added between the common line 101 and the capacitor C3 in the high-pass circuit 1H. This improves the matching of the high-pass circuit 1H.

Figure 5:
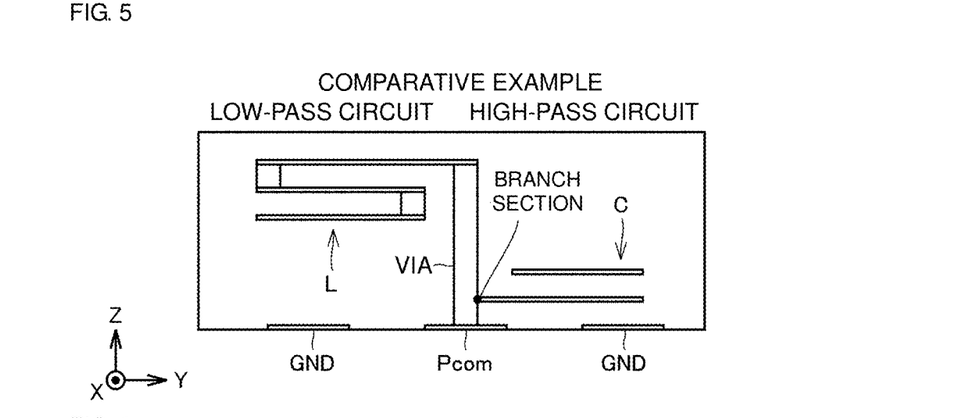
FIG. 5 is a schematic diagram of an internal configuration of a diplexer according to a first comparative example.
Figure 6:
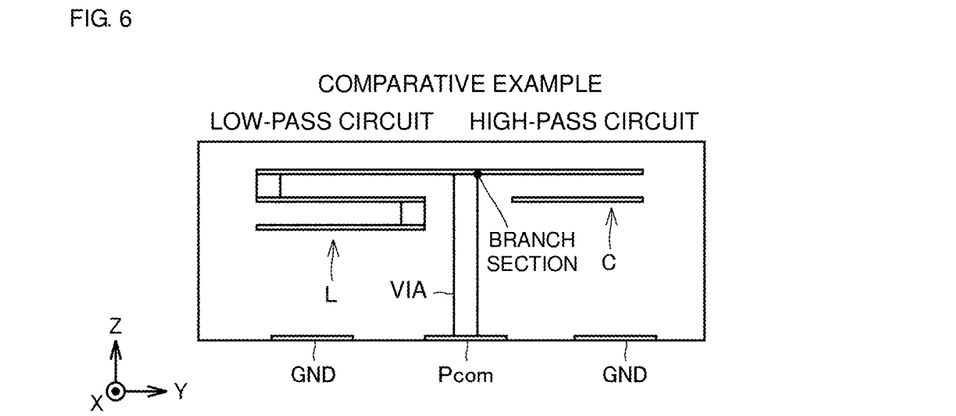
FIG. 6 is a schematic diagram of an internal configuration of a diplexer according to a second comparative example.

FIGS. 5 and 6 are schematic diagrams of internal configurations of diplexers according to comparative examples. In FIGS. 5 and 6, as with FIG. 4 described above, a circuit from a common terminal Pcom to a capacitor C in a high-pass circuit and a circuit from the common terminal Pcom to an inductor L in a low-pass circuit are illustrated, and other circuits are omitted.

In the comparative examples illustrated in FIGS. 5 and 6, a single via extends from the common terminal Pcom to near the top surface of the multilayer body, and the via is directly connected to the capacitor C in the high-pass circuit and the inductor L in the low-pass circuit. FIG. 5 illustrates an example in which the inductor L in the low-pass circuit is disposed on a high layer and the capacitor C in the high-pass circuit is disposed on a low layer. FIG. 6 illustrates an example in which the inductor L in the low-pass circuit and the capacitor C in the high-pass circuit are both disposed on high layers. In both of the comparative examples, the capacitor C in the high-pass circuit is connected to the via at the same layer as the layer where the capacitor C is disposed. In other words, in each of the comparative examples, which include the branch portion branching into the path from the single via to the high-pass circuit and that to the low-pass circuit, no via is provided in the path from the branch portion to the capacitor C in the high-pass circuit, and no inductance component provided by the via is added.

In contrast, in the diplexer 1 according to the present preferred embodiment, the first via B1 extending in the Z-axis direction is disposed in the path from the branch portion Pd to the capacitor C3 in the high-pass circuit 1H, and the inductance component (inductor L3) provided by the first via B1 is added. Thus, the matching of the high-pass circuit 1H is improved, and the characteristics of the high-pass circuit 1H are improved.

Figure 7:
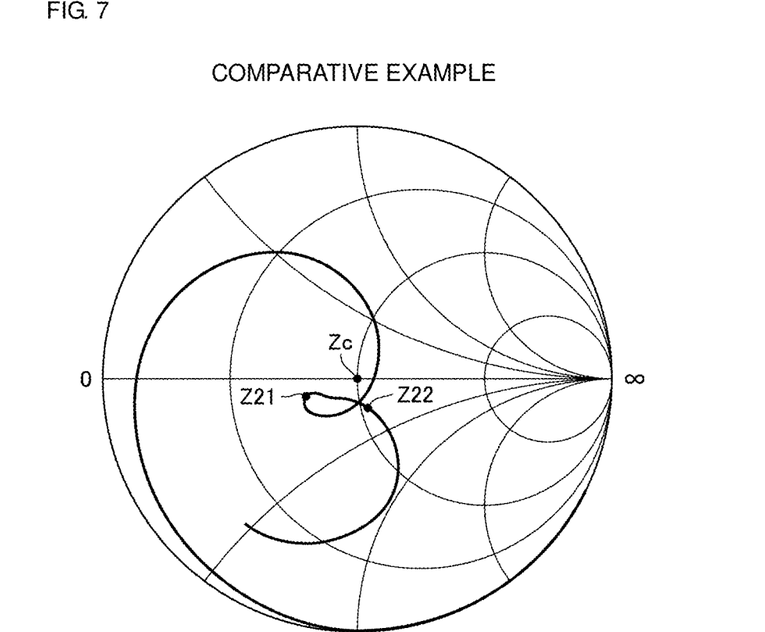
FIG. 7 is a Smith chart that illustrates example frequency characteristics of impedance of a high-pass circuit in the diplexer according to the first comparative example.
Figure 8:
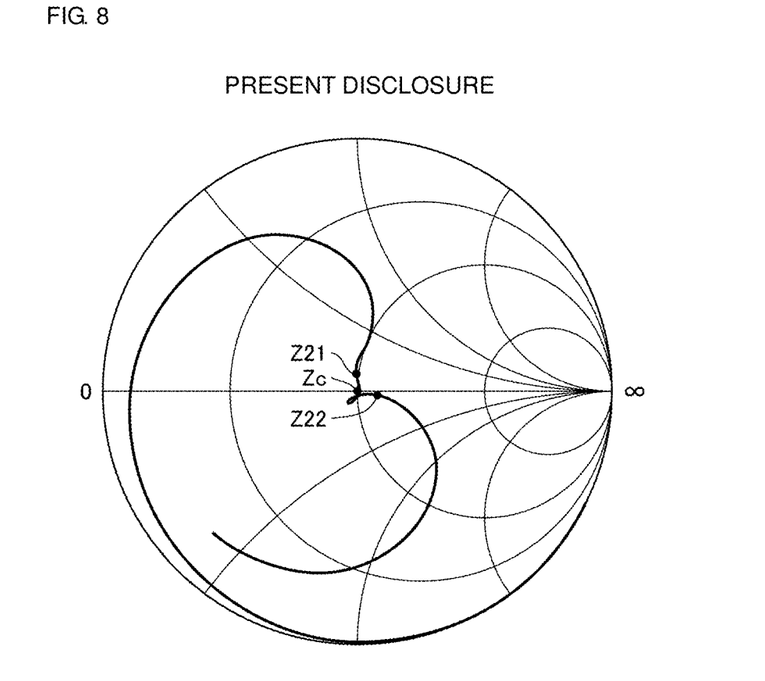
FIG. 8 is a Smith chart that illustrates example characteristics of a high-band high-pass circuit according to a preferred embodiment of the present invention.

FIG. 7 is a Smith chart that illustrates example frequency characteristics of impedance of the high-pass circuit in the diplexer according to the comparative example illustrated in FIG. 5. FIG. 8 is a Smith chart that illustrates example characteristics of the high-pass circuit 1H in the diplexer 1 according to the present preferred embodiment. In the Smith charts, the center indicates characteristic impedance Zc (e.g., about 50Ω), and as the impedance is nearer the characteristic impedance Zc at the center, the impedance matching is better.

In FIGS. 7 and 8, the range of frequencies is the range of about 0.5 GHz to about 6.5 GHz. Impedance Z21 indicates impedance at the lower-limit frequency f21 of the high band HB, and impedance Z22 indicates impedance at the upper-limit frequency f22 of the high band HB. FIGS. 7 and 8 illustrate examples in which the lower-limit frequency f21 and the upper-limit frequency f22 of the high band HB are about 2.30 GHz and about 2.69 GHz, respectively.

As is understood from the drawings, the values to which the impedance of the high-pass circuit in the diplexer 1 according to the present preferred embodiment is matched is nearer the characteristic impedance Zc in the high band HB than the values to which the impedance of the high-pass circuit in the diplexer according to the comparative example illustrated in FIG. 7 is matched, and the impedance matching is improved. This improvement can be considered to arise from the addition of the inductance component (inductor L3) provided by the first via B1 to the path from the branch portion Pd to the capacitor C3 in the high-pass circuit 1H in the diplexer 1 according to the present preferred embodiment.

Figure 9:
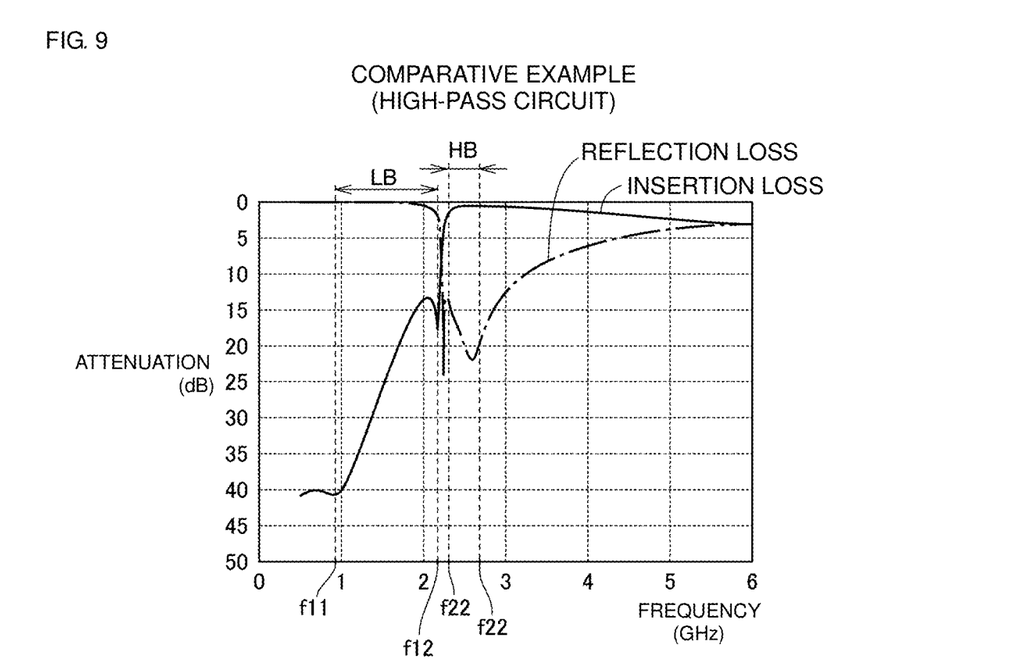
FIG. 9 illustrates example characteristics of the high-pass circuit in the diplexer according to the first comparative example.
Figure 10:
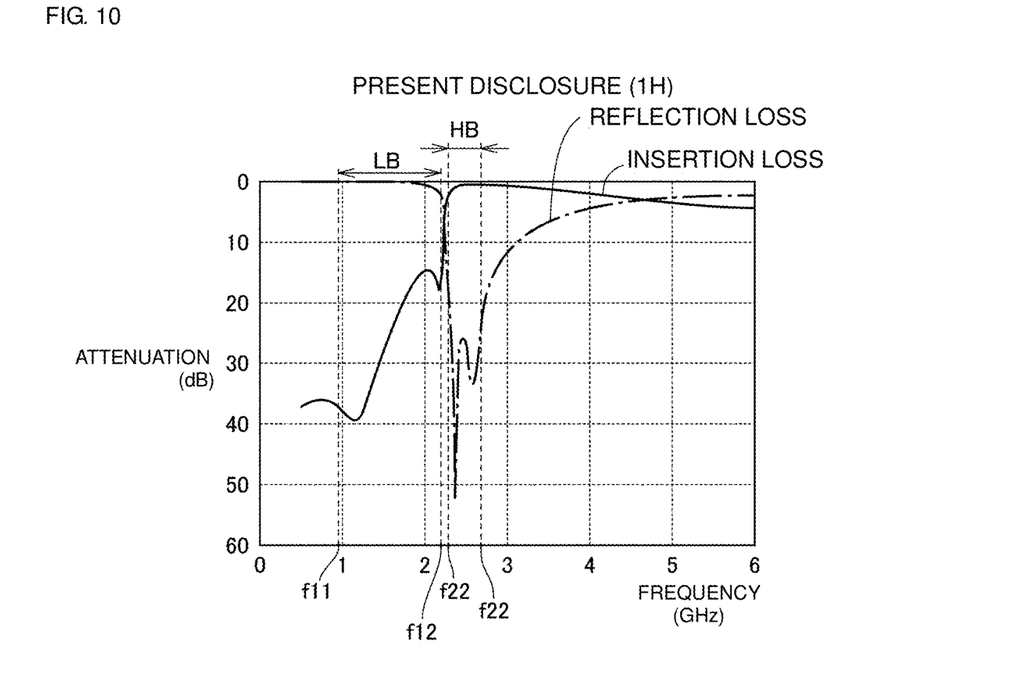
FIG. 10 illustrates example characteristics of the high-pass circuit in a diplexer according to a preferred embodiment of the present invention.

FIG. 9 illustrates example characteristics of the high-pass circuit in the diplexer according to the comparative example illustrated in FIG. 5. FIG. 10 illustrates example characteristics of the high-pass circuit 1H in the diplexer 1 according to the present preferred embodiment.

In FIGS. 9 and 10, the solid line indicates frequency characteristics of an insertion loss (bandpass characteristic) of the high-pass circuit, and the dot-and-dash line indicates frequency characteristics of a return loss (reflection characteristic) of the high-pass circuit. In FIGS. 9 and 10, the horizontal axis indicates the frequency (GHz), and the vertical axis indicates the insertion loss or the return loss as an attenuation.

FIGS. 9 and 10 illustrate examples in which the lower-limit frequency f11 and the upper-limit frequency f12 of the low band LB are about 0.96 GHz and about 2.20 GHz, respectively, and the lower-limit frequency f21 and the upper-limit frequency f22 of the high band HB are about 2.30 GHz and about 2.69 GHz, respectively. The same applies to FIGS. 11, 12, 14, and 15 described below.

The insertion loss indicates the ratio of power transmitted to other terminals to power input into a terminal in an electronic component expressed in decibels (dB). Accordingly, as the insertion loss is smaller (nearer to zero), the proportion of signals lost inside the electronic component is smaller, and this means that signals pass more easily.

The return loss indicates the ratio of reflection power to power input into a terminal in an electronic component expressed in decibels (dB). Accordingly, as the return loss is larger (more remote from zero), the proportion of reflected signals in signals input into the electronic component is smaller, and this means that signals pass through the electronic component more easily.

In the high band HB, in comparison with the insertion loss illustrated in FIG. 9, the insertion loss illustrated in FIG. 10 is slightly smaller (nearer to zero), and this indicates that the insertion loss (bandpass characteristic) is improved. In the high band HB, in comparison with the return loss illustrated in FIG. 9, the return loss illustrated in FIG. 10 is significantly larger (more remote from zero), and this indicates that the return loss is significantly improved. Those improvements are considered to arise from the improved matching by the addition of the inductance component (inductor L3) provided by the first via B1.

In the examples illustrated in FIGS. 9 and 10, the band width between the low band LB and the high band HB is on the order of about 100 MHz (=about 2.30 GHz about 2.20 GHz), and it is a very narrow width corresponding to approximately 4% with respect to high-frequency signals in the vicinity of about 2.2 GHz. In such a case where the band width between the low band LB and the high band HB is narrow, the high-pass circuit 1H in the diplexer according to the present preferred embodiment can have satisfactory return-loss characteristics because of the addition of the inductance component (inductor L3) provided by the first via B1.

The above-described addition of the inductance component provided by the first via B1 to the high-pass circuit has little effect on the characteristics of the low-pass circuit 1L.

Figure 11:
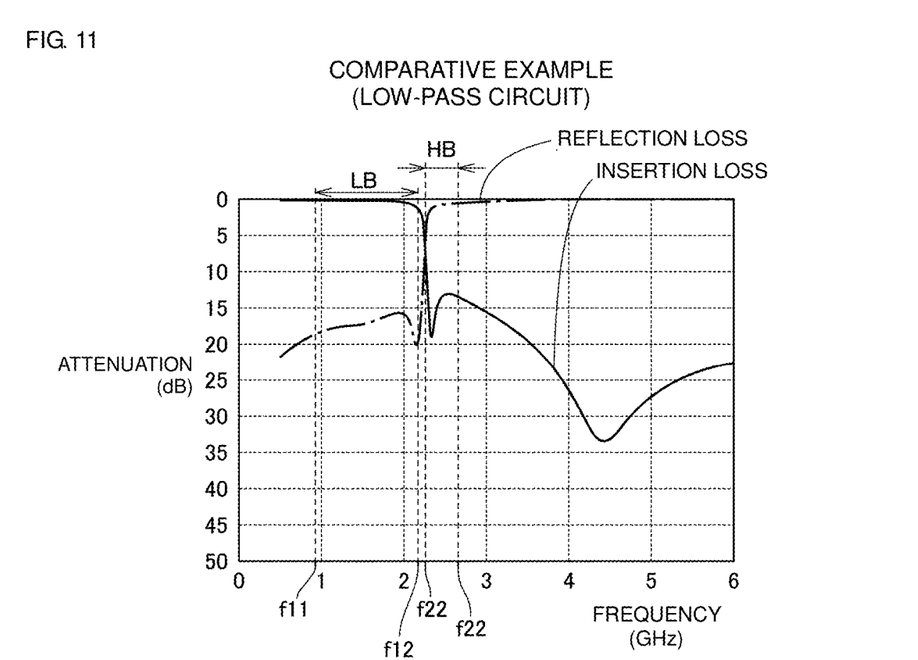
FIG. 11 illustrates example characteristics of the low-pass circuit in the diplexer according to the first comparative example.
Figure 12:
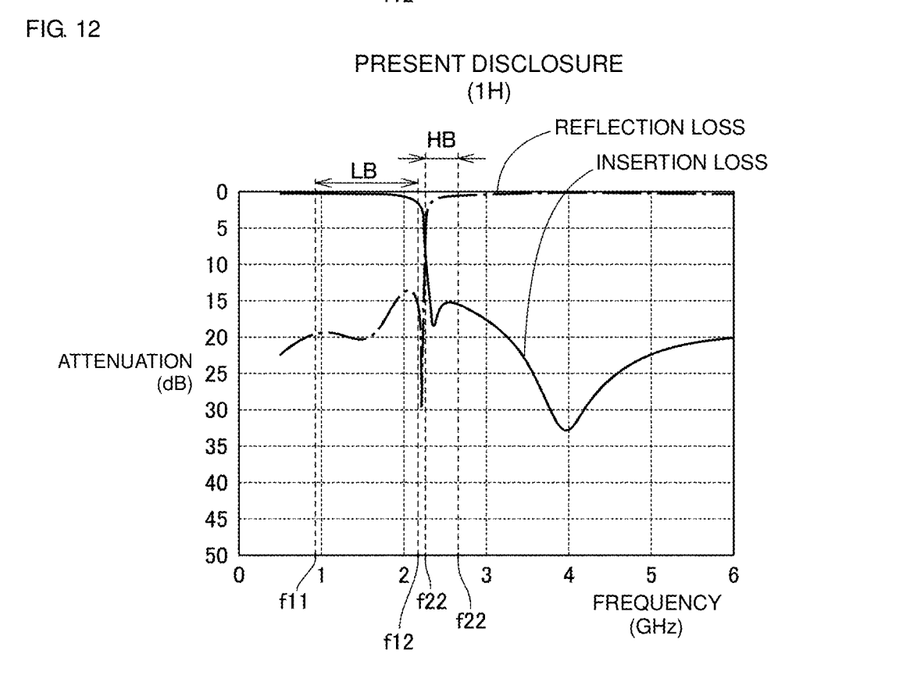
FIG. 12 illustrates example characteristics of the low-pass circuit in a diplexer according to a preferred embodiment of the present invention.

FIG. 11 illustrates example characteristics of the low-pass circuit in the diplexer according to the comparative example illustrated in FIG. 5. FIG. 12 illustrates example characteristics of the low-pass circuit 1L in the diplexer 1 according to the present preferred embodiment. In FIGS. 11 and 12, the solid line indicates frequency characteristics of an insertion loss (bandpass characteristic) of the low-pass circuit, and the dot-and-dash line indicates frequency characteristics of a return loss (reflection characteristic) of the low-pass circuit. In FIGS. 11 and 12, the horizontal axis indicates the frequency (GHz), and the vertical axis indicates the insertion loss or the return loss as an attenuation.

In the low band LB, the insertion loss and the return loss illustrated in FIG. 11 are the same or approximately the same as those illustrated in FIG. 10. Accordingly, the addition of the inductance component provided by the first via B1 to the high-pass circuit has little effect on the characteristics of the low-pass circuit.

Isolation Between High-Pass Circuit and Low-Pass Circuit

Moreover, in the diplexer 1 according to the present preferred embodiment, the first via B1, which connects the branch portion Pd and the capacitor C3 in the high-pass circuit 1H, and the second via B2, which connects the branch portion Pd and the inductor L1 in the low-pass circuit 1L, are parallel or substantially parallel and adjacent to each other. Thus, the isolation between the high-pass circuit 1H and the low-pass circuit 1L is improved. In the present preferred embodiment, the space between the first via B1 and the second via B2 is preferably about 250 μm, for example. In the case of a filter with a pass band (upper-limit frequency to lower-limit frequency) not more than about 5 GHz, the space between the first via B1 and the second via B2 may preferably be not more than about 500 μm, for example. If the space between the first via B1 and the second via B2 is larger than about 500 μm, it is expected that magnetic coupling will not be obtained and thus advantageous effects will not be achieved.

Figure 13:
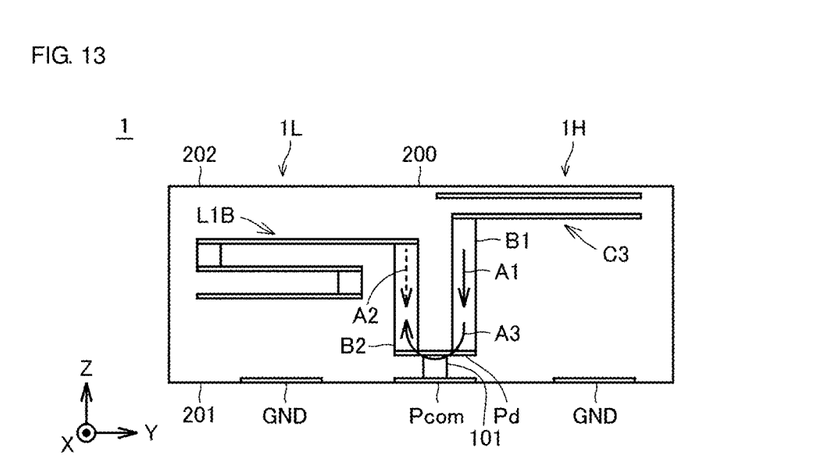
FIG. 13 schematically illustrates signals flowing through a first via and a second via.

FIG. 13 schematically illustrates signals flowing through the first via B1 and the second via B2 in causing signals to pass from the high-pass circuit 1H toward the common terminal Pcom. In causing signals to pass from the high-pass circuit 1H toward the common terminal Pcom, a signal A1 flows through the first via B1 in the negative direction in the Z axis. At that time, because the second via B2 is parallel or substantially parallel and adjacent to the first via B1, a signal A2 produced by magnetic coupling with the first via B1 flows through the second via B2 in the negative direction in Z axis. Consequently, a signal A3 that is about to enter the second via B2 from the first via B1 through the branch portion Pd can be cancelled out by the signal A2, which is produced by the magnetic coupling. Thus, the occurrence of transmission of signals from the first via B1 to the second via B2 can be reduced, and the isolation between the high-pass circuit 1H and the low-pass circuit 1L can be improved.

Figure 14:
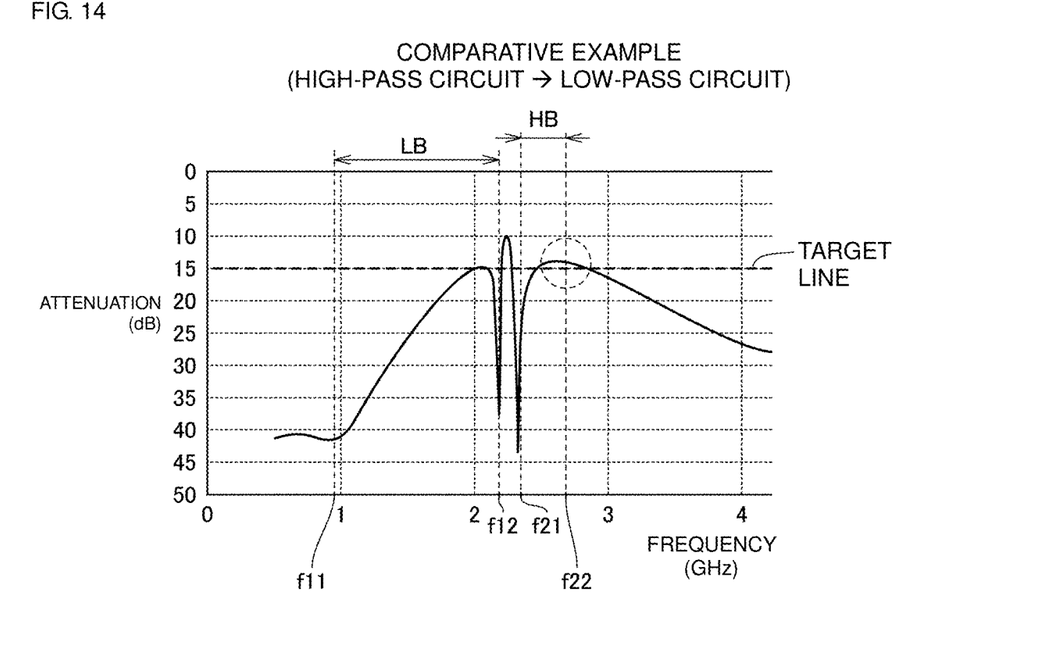
FIG. 14 illustrates isolation characteristics between the low-pass circuit and the high-pass circuit in the diplexer according to the first comparative example.
Figure 15:
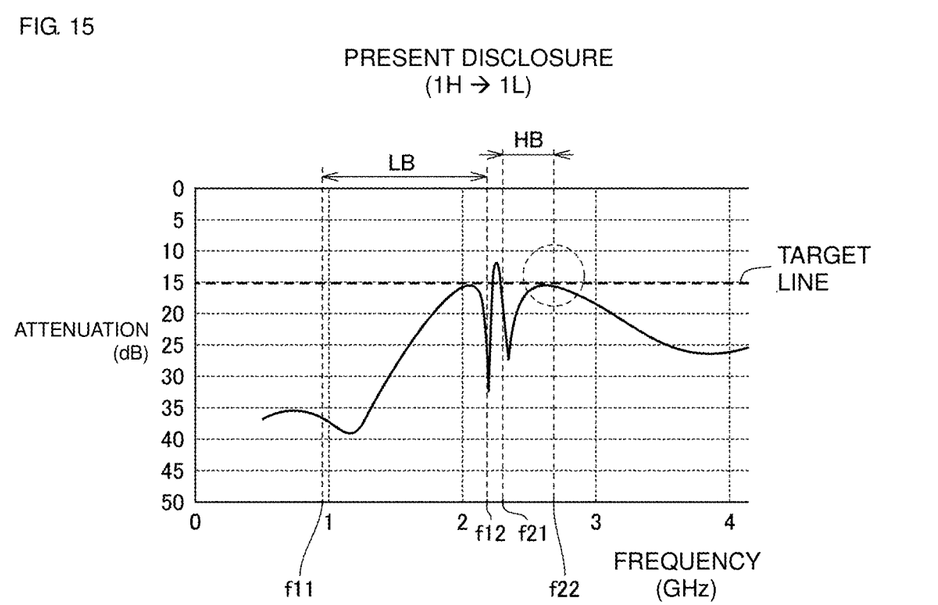
FIG. 15 illustrates isolation characteristics between the low-pass circuit and the high-pass circuit in a diplexer according to a preferred embodiment of the present invention.

FIG. 14 illustrates isolation characteristics between the low-pass circuit and the high-pass circuit in the diplexer according to the comparative example illustrated in FIG. 5. FIG. 15 illustrates isolation characteristics between the low-pass circuit 1L and the high-pass circuit 1H in the diplexer 1 according to the present preferred embodiment. In FIGS. 14 and 15, the horizontal axis indicates the frequency (GHz), and the vertical axis indicates the isolation characteristics between the low-pass circuit and the high-pass circuit. The isolation indicates the ratio of power transmitted to the second terminal PL in the low-pass circuit 1L to power input into the first terminal PH in the high-pass circuit 1H expressed as an attenuation in decibels (dB). As the attenuation is larger (more remote from zero), the occurrence of transmission of signals from the high-pass circuit 1H to the low-pass circuit 1L can be further reduced, and the isolation characteristics are improved.

The target line for the isolation between the low-pass circuit and the high-pass circuit is on the order of about 15 dB, for example, and the isolation may preferably be larger than the target line (about 15 dB). In the comparative example illustrated in FIG. 14, however, the frequency band where the isolation is smaller than the target line (about 15 dB) is included in the high band HB. In contrast, in the diplexer 1 according to the present preferred embodiment, as revealed in FIG. 15, the isolation is larger than the target line (about 15 dB) at all frequencies in the high band HB and the isolation is improved. That improvement is considered to arise from the arrangement in which the first via B1 and the second via B2 are parallel or substantially parallel and adjacent to each other.

The advantage of the improvement in isolation is affected by a phase difference between the signal A2 produced by the magnetic coupling and the signal A3 being about to enter the second via B2. Thus, to appropriately improve the isolation, the signal A2 and the signal A3 may preferably have opposite phases by, for example, adjustment of the length of the first via B1.

As described above, in the diplexer 1 according to the present preferred embodiment, the branch portion Pd, which is connected to the upper-side end portion of the common line 101, and the capacitor C3 in the high-pass circuit 1H are connected by the first via B1. By the first via B1, the inductance component (inductor L3) is added between the branch portion Pd and the capacitor C3 in the high-pass circuit 1H. Thus, the return loss in the high-pass circuit 1H can be appropriately reduced or prevented.

In the diplexer 1, because the branch portion Pd and the capacitor C3 in the high-pass circuit 1H are connected by the first via B1, which has a relatively large diameter, the inductance component can be added while the conductor loss can be reduced or prevented.

The first via B1 extends along the lamination direction from the first layer LY1, where the branch portion Pd is disposed, to the second layer LY2, which is higher than the first layer LY1, and is connected to the capacitor C3 in the high-pass circuit 1H at the second layer LY2. Thus, the capacitor C3 in the high-pass circuit 1H can be arranged in a position higher than the branch portion Pd (position remote from the ground terminal GND). Therefore, the occurrence of stray capacitance between the capacitor C3 in the high-pass circuit 1H and the ground terminal GND can be reduced or prevented.

Moreover, the branch portion Pd and the inductor L1 in the low-pass circuit 1L are connected by the second via B2. The second via B2 extends along the lamination direction from the first layer LY1, where the branch portion Pd is disposed, to the third layer LY3, which is higher than the first layer LY1, and is connected to the inductor L1 in the low-pass circuit 1L at the third layer LY3. Thus, the inductor L1 in the low-pass circuit 1L can be arranged in a position higher than the branch portion Pd (position remote from the ground terminal GND). Therefore, the occurrence of stray capacitance between the inductor L1 in the low-pass circuit 1L and the ground terminal GND can also be reduced or prevented.

Furthermore, the height h2 of the second layer LY2 is larger than the height h1 of the first layer LY1 by the difference Δh. That is, the capacitor C3 in the high-pass circuit 1H is arranged in the position more remote from the ground terminal GND by the difference Δh than the inductor L1 in the low-pass circuit 1L. Thus, the occurrence of stray capacitance of the capacitor C3 in the high-pass circuit 1H can be further reduced or prevented. Therefore, degradation in loss can be reduced or prevented in up to the high range of the high band HB.

In addition, for example, the height h1 of the first layer LY1 is preferably smaller than about one-half of the dimension H of the diplexer 1 in the lamination direction, and the height h2 of the second layer LY2 and the height h3 of the third layer LY3 are preferably not smaller than about one-half of the dimension H of the diplexer 1 in the lamination direction. Thus, with the sufficient heights h2 and h3, the occurrence of stray capacitance of the capacitor C3 and the inductor L1 can be reduced or prevented, and with the sufficient length of the first via B1, the satisfactory inductance component provided by the first via B1 can be achieved.

Moreover, the first via B1 and the second via B2 are parallel or substantially parallel and adjacent to each other. Thus, while signals flow from the first via B1 toward the common terminal Pcom, a signal being about to enter the second via B2 from the first via B1 through the branch portion Pd can be cancelled out by a signal produced in the second via B2 by the magnetic coupling with the first via B1. Therefore, the isolation between the high-pass circuit 1H and the low-pass circuit 1L can be improved.

First Variation

The above-described preferred embodiment is an example in which the first via B1 extends from the first layer LY1 to the second layer LY2 along the lamination direction in a straight line. The first via B1, however, may be separated in the X-axis direction or in the Y-axis direction at an intermediate layer between the first layer LY1 and the second layer LY2.

Figure 16:
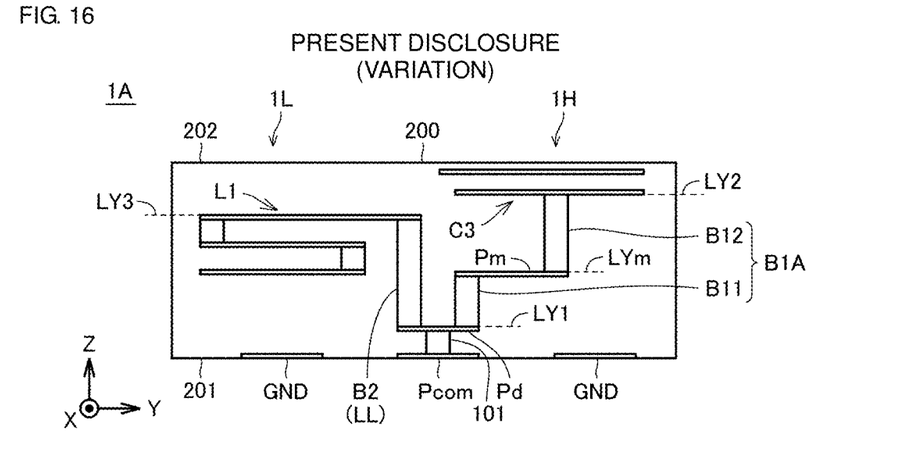
FIG. 16 is a schematic diagram of an internal configuration of a diplexer according to a first variation of a preferred embodiment of the present invention.

FIG. 16 is a schematic diagram of an internal configuration of a diplexer 1A according to a first variation of a preferred embodiment of the present invention. The diplexer 1A is one in which the first via B1 in the above-described diplexer 1 is replaced with a first via B1A. The remaining configuration is the same or substantially the same as that of the above-described diplexer 1, and the detailed description of it is not repeated here.

The first via B1A includes a first via segment B11 and a second via segment B12.

The first via segment B11 extends along the lamination direction from the first layer LY1 to an intermediate layer LYm between the first layer LY1 and the second layer LY2. A connecting plate Pm is disposed on the intermediate layer LYm and extends along the Y-axis direction. The extending direction of the connecting plate Pm may not be the Y-axis direction and may be the Z-axis direction.

The second via segment B12 is connected to the first via segment B11 with the connecting plate Pm disposed on the intermediate layer LYm and interposed therebetween and extends along the lamination direction from the intermediate layer LYm toward second layer LY2.

When the first via B1A includes the separated segments, as described above, an inductance component provided by the first via B1A is added between the branch portion Pd and the capacitor C3 in the high-pass circuit 1H, as in the case of the above-described preferred embodiment. Therefore, the return loss in the high-pass circuit 1H can be appropriately reduced or prevented.

Moreover, the separation of the first via B1A facilitates the adjustment of the length from the branch portion Pd to the capacitor C3 in the high-pass circuit 1H. Thus, the value of the inductance component added between the branch portion Pd and the capacitor C3 in the high-pass circuit 1H can be easily adjusted.

FIG. 16 illustrates an example in which the first via B1A is separated into the two segments. The first via may be separated into three or more segments.

Figure 17:
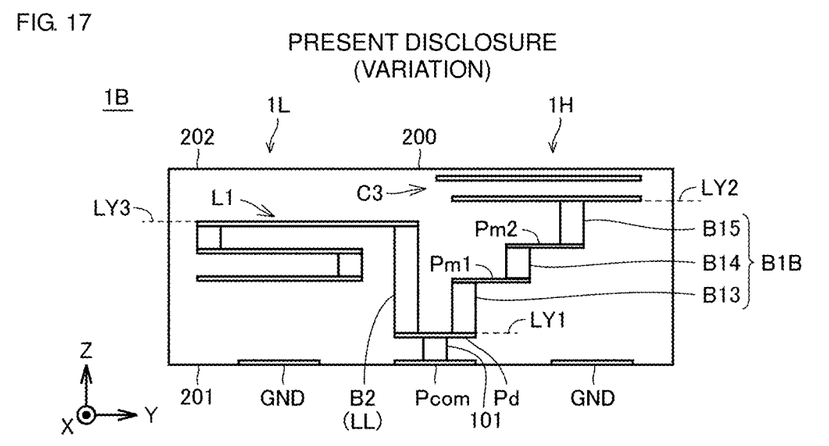
FIG. 17 is a schematic diagram of an internal configuration of another diplexer according to the first variation of a preferred embodiment of the present invention.

FIG. 17 is a schematic diagram of an internal configuration of another diplexer 1B according to the first variation. The diplexer 1B is one in which the first via B1 in the above-described diplexer 1 is replaced with a first via B1B. The remaining configuration is the same or substantially the same as that of the above-described diplexer 1, and the detailed description of it is not repeated here.

The first via B1B includes three via segments B13, B14, and B15. The via segments B13 and B14 are connected with a connecting plate Pm1 extending in the Y-axis direction and interposed therebetween. The via segments B14 and B15 are connected with a connecting plate Pm2 extending in the Y-axis direction and interposed therebetween. The extending direction of each of the connecting plates Pm1 and Pm2 may not be the Y-axis direction and may be the Z-axis direction.

The connecting plate Pm1 and the connecting plate Pm2 are arranged in this order in the direction from the first layer LY1 to the second layer LY2. Accordingly, the first via B1B extends in three stages with different positions in the Y-axis direction between the first layer LY1 and the second layer LY2.

Figure 18:
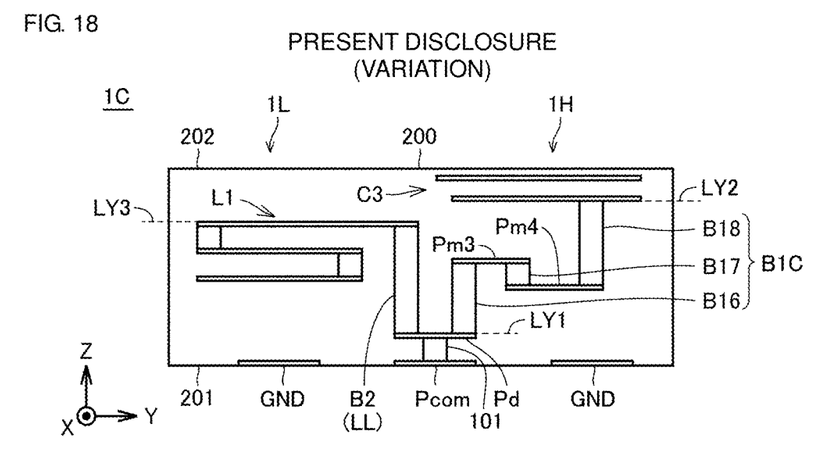
FIG. 18 is a schematic diagram of an internal configuration of another diplexer according to the first variation of a preferred embodiment of the present invention.

FIG. 18 is a schematic diagram of an internal configuration of another diplexer 1C according to the first variation. The diplexer 1C is one in which the first via B1 in the above-described diplexer 1 is replaced with a first via B1C. The remaining configuration is the same or substantially the same as that of the above-described diplexer 1, and the detailed description of it is not repeated here.

The first via B1C includes three via segments B16, B17, and B18. The via segments B16 and B17 are connected with a connecting plate Pm3 extending in the Y-axis direction and interposed therebetween. The via segments B17 and B18 are connected with a connecting plate Pm4 extending in the Y-axis direction and interposed therebetween. The extending direction of each of the connecting plates Pm3 and Pm4 may not be the Y-axis direction and may be the Z-axis direction.

The connecting plate Pm4 and the connecting plate Pm3 are arranged in this order in the direction from the first layer LY1 to the second layer LY2. Accordingly, in the direction from the first layer LY1 to the second layer LY2, the first via B1C first extends in the positive direction in the Z axis, then extends in the negative direction in the Z axis with a different position in the Y-axis direction, and lastly extends in the positive direction in the Z axis with a different position in the Y-axis direction.

Even with the changed shapes illustrated in FIGS. 17 and 18, an inductance component provided by the first via B1B or first via B1C is added between the branch portion Pd and the capacitor C3 in the high-pass circuit 1H, as in the case of the above-described preferred embodiment, and thus the return loss in the high-pass circuit 1H can be appropriately reduced or prevented.

Second Variation

In the above-described preferred embodiment, examples in which the height h2 of the second layer LY2 and the height h3 of the third layer LY3 are larger than the height h1 of the first layer LY1 are described.

The relationship among the heights h1 to h3 is not limited to the above-described examples. For example, at least one of the height h2 of the second layer LY2 and the height h3 of the third layer LY3 may be smaller than the height h1 of the first layer LY1. In that case, from the viewpoint of reducing the occurrence of stray capacitance of the capacitor C3 in the high-pass circuit 1H and the occurrence of stray capacitance of the inductor L1 in the low-pass circuit 1L, the height h2 of the second layer LY2 and the height h3 of the third layer LY3 may preferably have satisfactory lengths.

Third Variation

In the above-described preferred embodiment, examples in which the first via B1 and the second via B2 are connected to the common terminal Pcom with the common line 101 interposed therebetween are described.

The common line 101 may be omitted, and the first via B1 and the second via B2 may be directly connected to the common terminal Pcom. That is, the first via B1 may extend along the lamination direction from the common terminal Pcom to the second layer LY2 where the capacitor C3 in the high-pass circuit 1H is disposed. The second via B2 may extend along the lamination direction from the common terminal Pcom to the third layer LY3 where the inductor L1 in the low-pass circuit 1L is disposed.

Even with that changed shape, the inductance component provided by the first via B1 is added between the branch portion Pd and the capacitor C3 in the high-pass circuit 1H, as in the case of the above-described preferred embodiment, and thus the return loss in the high-pass circuit 1H can be appropriately reduced or prevented.

The preferred embodiments disclosed herein may be combined and implemented as appropriate within a consistent range. The preferred embodiments disclosed herein should be considered in all respects as illustrative and not restrictive. The scope of the present invention is defined by the appended claims, rather than by the description above. All changes within the meaning and range of equivalency of the appended claims are to be embraced within the scope.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A diplexer comprising:
a plurality of dielectric layers laminated in a lamination direction;
a reference surface extending in a direction orthogonal or substantially orthogonal to the lamination direction;
a common terminal disposed on the reference surface;
a high-pass circuit configured to allow a signal with a frequency higher than a characteristic frequency to pass therethrough;
a low-pass circuit configured to allow a signal with a frequency lower than the characteristic frequency to pass therethrough;
a common line including a first end portion connected to the common terminal;
a first line connecting a second end portion of the common line and the high-pass circuit; and
a second line connecting the second end portion of the common line and the low-pass circuit; wherein
the high-pass circuit includes a capacitor connected to the first line;
the first line includes a first via extending along the lamination direction from a first layer at which the second end portion of the common line is located to a second layer at which the capacitor in the high-pass circuit is located;
the low-pass circuit includes an inductor connected to the second line; and
the second line includes a second via extending along the lamination direction from the first layer to a third layer where the inductor in the low-pass circuit is located.

2. The diplexer according to claim 1, wherein the high-pass circuit includes an inductance component including the first via.

3. The diplexer according to claim 1, wherein
a ground terminal is located on the reference surface; and
a distance from the reference surface to the second layer in the lamination direction is longer than a distance from the reference surface to the third layer in the lamination direction.

4. The diplexer according to claim 1, wherein the first via includes a portion parallel or substantially parallel and adjacent to the second via.

5. The diplexer according to claim 1, wherein
the first via includes a first via segment and a second via segment;
the first via segment extends along the lamination direction from the first layer to an intermediate layer between the first layer and the second layer;
the second via segment is connected to the first via segment with a connecting plate interposed therebetween, the connecting plate extends in a direction orthogonal or substantially orthogonal to the lamination direction, and the second via segment extends along the lamination direction from the intermediate layer toward the second layer.

6. The diplexer according to claim 1, wherein
a ground terminal is located on the reference surface; and
a distance from the reference surface to the second layer in the lamination direction is longer than a distance from the reference surface to the first layer in the lamination direction.

7. The diplexer according to claim 6, wherein
the distance from the reference surface to the first layer in the lamination direction is less than about one-half of a dimension of the diplexer in the lamination direction; and
the distance from the reference surface to the second layer in the lamination direction and the distance from the reference surface to the third layer in the lamination direction are not less than the dimension of the diplexer in the lamination direction.

8. The diplexer according to claim 1, further comprising a first terminal and a second terminal; wherein
the high-pass circuit is connected between the first line and the first terminal; and
the low-pass circuit is connected between the second line and the second terminal.

9. The diplexer according to claim 1, wherein the low-pass circuit includes an inductance component including the second via.

10. A diplexer comprising:
a plurality of dielectric layers laminated in a lamination direction;
a reference surface extending in a direction orthogonal or substantially orthogonal to the lamination direction;
a common terminal disposed on the reference surface;
a high-pass circuit configured to allow a signal with a frequency higher than a characteristic frequency to pass therethrough;
a low-pass circuit configured to allow a signal with a frequency lower than the characteristic frequency to pass therethrough;
a first line connecting the common terminal and the high-pass circuit; and
a second line connecting the common terminal and the low-pass circuit and different from the first line; wherein
the high-pass circuit includes a capacitor connected to the first line;
the first line includes a first via extending along the lamination direction from the common terminal to a layer where the capacitor in the high-pass circuit is disposed;
the low-pass circuit includes an inductor connected to the second line;
the second line includes a second via extending along the lamination direction; and
the first via includes a portion parallel or substantially parallel and adjacent to the second via.

11. The diplexer according to claim 10, further comprising a first terminal and a second terminal; wherein
the high-pass circuit is connected between the first line and the first terminal; and
the low-pass circuit is connected between the second line and the second terminal.

12. The diplexer according to claim 10, wherein the low-pass circuit includes an inductance component including the second via.

13. A diplexer comprising:
a plurality of dielectric layers laminated in a lamination direction;
a reference surface extending in a direction orthogonal or substantially orthogonal to the lamination direction;
a common terminal disposed on the reference surface;
a high-pass circuit configured to allow a signal with a frequency higher than a characteristic frequency to pass therethrough;

a low-pass circuit configured to allow a signal with a frequency lower than the characteristic frequency to pass therethrough;
a first line connecting the common terminal and the high-pass circuit; and
a second line connecting the common terminal and the low-pass circuit and different from the first line; wherein
the high-pass circuit includes a capacitor connected to the first line;
the first line includes a first via extending along the lamination direction from the common terminal to a layer where the capacitor in the high-pass circuit is disposed; and
the high-pass circuit includes an inductance component including the first via.

14. The diplexer according to claim 13, further comprising a first terminal and a second terminal; wherein
the high-pass circuit is connected between the first line and the first terminal; and
the low-pass circuit is connected between the second line and the second terminal.

15. The diplexer according to claim 13, wherein
the low-pass circuit includes an inductor connected to the second line; and
the second line includes a second via extending along the lamination direction.

16. The diplexer according to claim 15, wherein the low-pass circuit includes an inductance component including the second via.

* * * * *